United States Patent
Naito

(10) Patent No.: US 8,653,490 B2
(45) Date of Patent: Feb. 18, 2014

(54) ION IMPLANTER

(75) Inventor: Masao Naito, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 0 days.

(21) Appl. No.: 13/588,735

(22) Filed: Aug. 17, 2012

(65) Prior Publication Data

US 2013/0042809 A1 Feb. 21, 2013

(30) Foreign Application Priority Data

Aug. 17, 2011 (JP) ................................ 2011-178472

(51) Int. Cl.
*G21K 5/04* (2006.01)

(52) U.S. Cl.
USPC .................... 250/492.3; 250/396 R; 250/397; 250/423 R

(58) Field of Classification Search
USPC .......... 250/423 R, 424, 492.1, 492.21, 492.3, 250/492.2, 396 R, 397
See application file for complete search history.

(56) References Cited

U.S. PATENT DOCUMENTS

| 7,435,976 B2 * | 10/2008 | Naito et al. ............... 250/492.21 |
| 2005/0253089 A1 * | 11/2005 | Maeno et al. ............... 250/491.1 |
| 2008/0135777 A1 * | 6/2008 | Yamashita et al. ............ 250/397 |

FOREIGN PATENT DOCUMENTS

JP 2005-327713 A 11/2005

OTHER PUBLICATIONS

Patent Abstracts of Japan, Publication No. 2005-327713, published on Nov. 24, 2005 (1 page).

* cited by examiner

*Primary Examiner* — Nicole Ippolito
(74) *Attorney, Agent, or Firm* — Procopio, Cory, Hargreaves & Savitch LLP

(57) ABSTRACT

The ion implanter includes a deflecting electrode and a shield member. The ion beam has a ribbon shape. The deflecting electrode deflects at least a part of the ion beam in a long side direction toward a short side direction of the ion beam, based on a result measured of a beam current density distribution in the long side direction. The shield member partially shields the ion beam deflected by the deflecting electrode. The deflecting electrode includes a plate electrode and an electrode group including plural electrodes. The electrode group is disposed to face the plate electrode to interpose the ion beam between the plate electrode and the electrode group. The plate electrode is electrically grounded, and the plurality of electrodes are electrically independent from each other. Each of the plurality of electrodes is connected to an independent power source from other power sources to perform a potential setting.

10 Claims, 7 Drawing Sheets

LOCATION IN BEAM CURRENT DENSITY MEASURING DEVICE

ION IMPLANTER

CROSS-REFERENCE TO RELATED APPLICATION(S)

This application claims the benefit of Japanese Patent Application No.2011-178472, filed on Aug. 17, 2011, the entire contents of which are hereby incorporated by reference, the same as if set forth at length; the entire of which are incorporated herein by reference.

TECHNICAL FIELD

The present invention relates to an ion implanter including an electric field lens that adjusts a current density distribution in a longitudinal direction of a ribbon-like ion beam elongated in one direction.

Related Art

To deal with the increase in size of a substrate, an ion implanter utilizes a ribbon-like ion beam elongated in one direction. This ion beam has a substantially rectangular cross section when being cut in a plane perpendicular to a traveling direction of the ion beam. For example, the ion implanter transfers the substrate in a short side direction of the ribbon-like ion beam which is substantially perpendicular to a longitudinal direction of the ribbon-like ion beam, and irradiates the ion beam to the entire surface of the substrate, thereby performing the process of implanting the ion to the substrate.

Further, in association with miniaturization of a semiconductor device fabricated on the substrate, various adjustment means have been considered to adjust a beam current density distribution in the longitudinal direction of the ribbon-like ion beam to achieve a desired beam current density distribution.

Patent Document 1 discloses an example utilizing an electric field lens and another example utilizing an electromagnetic lens, as an adjustment means of the beam current density distribution. The detailed configuration thereof will now be described in brief later.

For the example utilizing the electric field lens, as described in FIG. 8 of Patent Document 1, plural pairs of electrodes are disposed along a longitudinal direction of an ion beam, with a ribbon-like ion beam being interposed between the pairs of electrodes from a short side direction. A voltage to be applied to the respective pairs of electrodes is respectively adjusted to generate an electric field between the pairs of electrodes which are arranged in a long side direction of the ion beam, thereby adjusting the beam current density distribution.

Meanwhile, for the example utilizing the electromagnetic lens, as described in FIG. 11 of Patent Document 1, a plurality of magnetic pole pairs are disposed along a longitudinal direction of an ion beam, with the ribbon-like ion beam being interposed between the magnetic pole pairs from a short side direction. A coil is wound around the respective magnetic pole pairs. An amount of the current and a direction of the current flowing in one pair of coils wound around the respective magnetic pole pairs are respectively adjusted to generate an electromagnetic field between the magnetic pole pairs which are arranged in a short side direction of the ion beam, thereby adjusting the beam current density distribution.

If the dimension of the ion beam is increased according to the increase in size of the substrate, an apparatus for generating the large ion beam is also increased in size. For example, the size of a conventional ion beam may be 790 mm in a long side direction. When the substrate size is increased, a size of an ion beam may be 1560 mm in the long side direction.

However, if the size of the apparatus is too large, a wide location in which a large apparatus is disposed is required in a semiconductor factory, which is less desirable in view of a relationship with a disposed location of other apparatus. Accordingly, there is a desire that an ion implanter is reduced in size as small as possible. As the means for adjusting the beam current density distribution, it is required for the use of the electric field lens having a size relatively smaller than that of the electromagnetic lens.

RELATED ART DOCUMENTS

Patent Documents

[Patent document 1] JP-A-2005-327713 (FIG. 8, FIG. 11, Paragraphs 0063 to 0066, and Paragraphs 0075 to 0081)

SUMMARY

In the electric field lens which is taken as one example in Patent Document 1, the electric field is generated along the long side direction of the ion beam, and then the ion beam in the long side direction is locally expanded or contracted. In the case where the expansion or contraction occurs on an end portion of the ion beam in the long side direction thereof, the ion beam irradiated to the substrate is changed in dimension in the long side direction.

If the dimension of the ion beam in the long side direction is longer, there is a possibility that the ion beam collides with a wall surface of a vacuum chamber configuring a transport path of the ion beam, or a member disposed in the transport path. In this instance, a beam current amount of the ion beam to be transferred is decreased. To avoid the decrease in the beam current amount, it will be considered that the vacuum chamber configuring the transport path or the member disposed in the transport path is slightly increased in size. If so, this leads the apparatus to increase in size. Meanwhile, in the case where the dimension of the ion beam in the long side direction is shortened, there is a concern that the entire surface of the substrate has a region, to which the ion beam is not irradiated, in particular, on an end portion of the substrate. And, there is a concern that the entire surface of the substrate has a region which does not reach to a desired beam current amount, even though the ion beam is irradiated. Further, if expansion or contraction of the ion beam in the long side direction is large, the above-described situation is so noticeable as the expansion or contraction.

Therefore, an object of the present invention is to provide an ion implanter capable of decreasing expansion or contraction of an ion beam in a long side direction in the case where a beam current density distribution of the ion beam having a substantially rectangular cross section in a long side direction is adjusted.

An ion implanter of this invention emits an ion beam from an ion source. An ion implanting is performed to a substrate disposed in a process chamber in the ion implanter. The ion beam has a positive charge and a substantially rectangular cross section or a substantially long ellipsoidal cross section having a long side direction and a short side direction. The ion implanter includes a beam current measuring device, a deflecting electrode and a shield member. The beam current measuring device measures a beam current density distribution of the ion beam in the long side direction. The deflecting electrode deflects at least a part of the ion beam in the long side direction toward the short side direction, based on a result measured by the beam current measuring device. The shield member partially shields the ion beam deflected by the deflecting electrode. The deflecting electrode includes a plate electrode and an electrode group including a plurality of electrodes. The electrode group is disposed to face the plate electrode so as to interpose the ion beam between the plate electrode and the electrode group. The plate electrode is electrically grounded. The plurality of electrodes are electrically independent from each other. Each of the plurality of electrodes is connected to an independent power source from other power sources to perform potential setting.

The electric field is generated in the short side direction of the ion beam when adjusting the beam current density distribution and the ion beam is locally deflected toward the substantially short side direction. Therefore, it is possible to significantly reduce expansion and contraction of the ion beam in the long side direction thereof which occurs in an electric field lens of the related art.

Additionally, it is preferable that the ion beam in the long side direction has a longer size than the substrate. The substrate is transferred along the short side direction of the ion beam when the ion implanting is performed to the substrate.

With the above configuration, it is possible to perform the ion implanting on the entire surface of the substrate at a desired ion implantation dose distribution.

Additionally, it is preferable that, when the result measured by the beam current measuring device does not satisfy with a desired value, the plurality of electrodes is set so that all electrodes has a negative potential or so that some electrodes are at a negative potential and the remaining electrodes are at ground potential.

With the above configuration, since the respective electrodes configuring the electrode group is at the negative potential or at the ground potential, electrons contained in the ion beam or electrons floating in a transport path of the ion beam are not drawn to the respective electrodes, but are reflected from the electrode having the negative potential to the ion beam side. The electrons reflected to the ion beam side serve to suppress emission of the ion beam due to the space charge effect. Accordingly, it is possible to reduce the possibility that the ion beam is emitted by the space charge effect and thus collides with a wall surface of the vacuum chamber configuring the transport path of the ion beam.

Further, it is preferable that the plurality of power sources are connected to a bias power source to collectively set potential of the plurality of power sources based on ground potential.

With the above configuration, it is possible to eliminate neutral particles generated in the beam path. Further, since the potential of the respective power sources connected to the electrode group is collectively adjusted by the bias power source, it is possible to reduce the power consumption of the power source, as compared to the case where the power source connected to the respective electrodes configuring the electrode group is respectively adjusted to eliminate the neutral particles. In addition, since it is not necessary to install a plurality of power source having a high voltage source capacity, a cost can be decreased to that extent.

On the other hand, it is preferable that the bias power source collectively sets the potential of the plurality of power sources at a negative potential.

In the example utilizing the above-described bias power source, since the electrons are not drawn to the respective electrodes configuring the electrode group, it is possible to reduce the emission of the ion beam due to the space charge effect, in addition to the above-described effects.

In the case of adjusting the beam current density distribution in the long side direction of the ion beam having the substantially rectangular cross section by means of the electric field lens, it is possible to significantly reduce the expansion and contraction of the ion beam in the long side direction thereof which occurs in the electric field lens of the related art.

BRIEF DESCRIPTION OF THE DRAWINGS

FIGS. 1A and 1B are plan views illustrating an ion implanter according to the present invention, in which FIG. 1A illustrates a state when seen from an X-Z plane, and FIG. 1B illustrates a state when seen from a Y-Z plane.

FIGS. 8A and 8B are plan views illustrating another ion implanter according to the present invention, in which FIG. 8A illustrates a state when seen from an X-Z plane, and FIG. 8B illustrates a state when seen from a Y-Z plane.

FIGS. 9A and 9B are plan views illustrating another ion implanter according to the present invention, in which FIG. 9A illustrates a state when seen from an X-Z plane, and FIG. 9B illustrates a state when seen from a Y-Z plane.

FIGS. 10A and 10B are diagrams illustrating an example of a configuration of the deflecting electrode shown in FIG. 9, in which FIG. 10A illustrates a connection example of a power source so that the respective electrodes configuring an electrode group is at a negative potential, and FIG. 10B illustrates a connection example of the power source so that the respective electrodes configuring the electrode group is at a positive potential.

DETAILED DESCRIPTION

One example of an ion implanter according to the present invention is illustrated in FIG. 1. A ribbon-like ion beam of the present invention has a substantially rectangular cross section or a substantially ellipsoidal cross section when being cut in a plane perpendicular to a traveling direction of the ion beam. The ion beam may have a circular shape as well as the rectangular shape and the long ellipse shape in cross-section. In this embodiment, a Z-direction is referred to as a traveling direction of a ribbon-like ion beam, a Y-direction is referred to as a long side direction of the ribbon-like ion beam, and an X-direction is referred to as a short side direction of the ribbon-like ion beam. And, when the ion beam has the long ellipsoidal cross section, the Y-direction may be referred to as a long axis direction of the ion beam and the X-direction may be referred to as a short axis direction of the ion beam. Further, the ion beam dealt in the present invention is an ion beam having a positive charge.

Figure 1A:
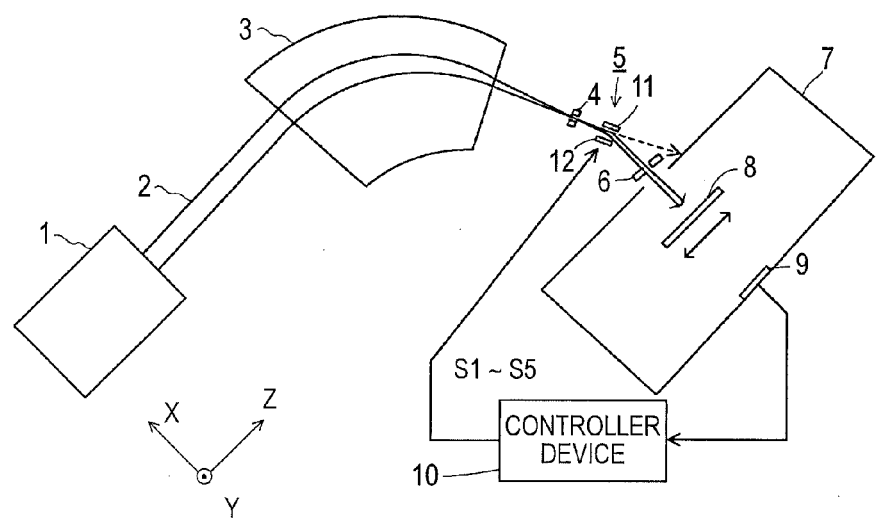

FIG. 1A illustrates a state of the ion implanter when seen from an X-Z plane. X, Y, and Z-axes illustrated in FIG. 1A are shown on the basis of an ion beam 2 immediately after it is emitted from an ion source 1. The traveling direction of the ion beam 2, that is, the Z-axis direction, is changed depending upon a location of the transport path. Accordingly, the X, Y, and Z-axis directions (X-direction, Y-direction, and Z-direction) are appropriately changed depending upon the location of the transport path of the ion beam 2. This is not limited to FIG. 1A, and is the same as other drawings.

The ion beam 2 emitted from the ion source 1 may have a substantially rectangular cross section when being cut in a plane perpendicular to the Z-direction. The ion beam 2 emitted from the ion source 1 may have a substantially long ellipsoidal cross section as well as the rectangular cross section. Further, the ion beam 2 emitted from the ion source 1 may be expanded or contracted in the short side direction of the ion beam, which is the X-direction. Specifically, the expanded ion beam may have a convex curve which is expanded convexly in the short side direction in cross-section. And, the contracted ion beam may have a concave curve which is contracted in the short side direction in cross-section.

The ribbon-like ion beam 2 emitted from the ion source 1 passes through a mass analyzing magnet 3. The ion beam 2 contains various kinds of ions according to kinds of ionized gas supplied to the ion source 1. Therefore, the mass of the ion beam 2 is analyzed by the mass analyzing magnet 3 and an analysis slit 4, which is disposed at a downstream side (Z-direction side) of the mass analyzing magnet 3, so as to irradiate the ion beam 2 containing a desired kind of ion to a substrate 8 (for example, a semiconductor substrate such as silicon wafer) which will be described later.

The ion beam 2 passed through the analysis slit 4 may have a substantially rectangular cross section when being cut in a plane perpendicular to the Z-direction.

Figure 1B:
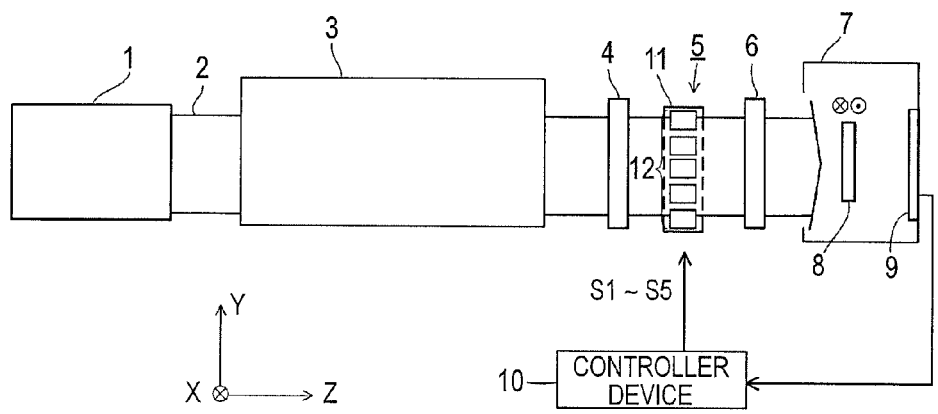

The ion beam 2 passed through the analysis slit 4 is incident on a deflecting electrode 5. The deflecting electrode 5 includes, as illustrated in FIG. 1B, a plate electrode 11 disposed at one side and an electrode group 12 disposed at the other side, with the ion beam 2 being interposed between the plate electrode and the electrode group from the short side direction (X-direction). In this embodiment, the ion beam 2 in the long side direction is locally deflected towards the substantially short side direction of the ion beam 2, so that at least a part of the ion beam 2 collides with a shield member 6 which is positioned at a downstream side of the deflecting electrode 5 to adjust the beam current density distribution of the ion beam 2 in the longitudinal direction thereof.

The shield member 6 may consist of, for example, two sheets of plates that form a slit in the passing path of the ion beam 2, as illustrated in FIG. 1A. If the deflection direction of the ion beam 2 in the deflecting electrode 5 is one direction, the shield member is not necessarily made of two sheets of plates, but may be made of one sheet of plate. Meanwhile, if the shield member is made of two sheets of plates, merits are as follows.

For example, to form a PN junction on the semiconductor substrate, there is a case where gas for P (for example, $PH_3$) is used as ionized gas, and a case where gas for N (for example, $BF_3$) is used as ionized gas. In this instance, upon the adjustment of the beam current density distribution in the present invention, since at least a part of the ion beam 2 collides (shields) with the shield member 6, components of the ionized gas may be adhered to the shield member 6. Accordingly, if the shield member 6 consists of one sheet of plate, when the ion implantation is performed using the gas for P, attachment formed when the ion implantation is performed using the gas for N may be peeled off and dropped from the shield member 6, and then be mixed into the ion beam 2 containing the gas for P as a main component. To prevent this mix, the shield member 6 is made of two sheets of plates. If so, the deflection direction of the ion beam 2 from the deflecting electrode 5 can be changed depending upon the kind of the ionized gas, which will be described later, thereby preventing the above-described mixing.

The ion beam 2, of which at least a part is shielded by the shield member 6, is introduced into a process chamber 7. The dimension of the ion beam 2 in the long side direction thereof is longer than that of the substrate 8 in the same direction, as illustrated in FIG. 1B. The substrate 8 is transferred in a direction indicated by an arrow, by a driving mechanism not shown in the figures in the process chamber 7, so that the ion implanting is performed on the entire surface of the substrate 8.

A beam current measuring device 9 is installed at the downstream side of the substrate which is disposed in the process chamber 7. The size of the beam current measuring device 9 is larger than that of the ion beam 2 in the long side direction (Y-direction), as illustrated in FIG. 1B, and is larger than that of the ion beam 2 in the short side direction (X-direction), as illustrated in FIG. 1A.

Before the ion implanting is performed on the substrate 8, the substrate 8 is disposed at a location, in which the substrate 8 is not irradiated by the ion beam 2, in the process chamber 7. Accordingly, the ion beam 2 introduced into the process chamber 7 before the ion implanting is irradiated to the beam current measuring device 9. The beam current measuring device 9 includes, for example, a plurality of Faraday cups disposed along the long side direction of the ion beam 2. The measurement of the beam current density distribution of the ion beam 2 in the long side direction thereof is performed by use of the beam current measuring device 9.

The measured result of the beam current density distribution measured by the beam current measuring device 9 is sent to a controller device 10. If the controller device 10 determines that the measured result of the beam current density distribution is not the desired distribution, the controller device 10 sends control signals S1 to S5 to power sources V1 to V5, which will be described later, connected to the electrode group 12 (five sheets of electrodes in this embodiment) configuring the deflecting electrode 5.

If a potential of the respective electrodes configuring the electrode group 12 is set by the control signals S1 to S5, the ion beam 2 in the long side direction is locally deflected towards a substantially short side direction, so that a part of the ion beam collides with the shield member 6 which is disposed at the downstream side of the deflecting electrode 5. After that, the beam current density distribution of the ion beam 2, of which at least a part there of is shielded by the shield member 6, is again measured by the beam current measuring device 9, and the measured result is sent to the controller device 10. In this instance, if it is determined that the measured result is the desired distribution, the controller device 10 transfers the substrate 8 to start the ion implanting.

Meanwhile, if it is determined that the measured result is not yet adjusted to the desired beam current density distribution, the controller device 10 again sends the control signals S1 to S5, and the potential adjustment of the respective electrodes is performed. The re-adjusting and re-measuring process is repeated until the beam current density distribution becomes the desired distribution. Further, to perform the adjustment in stages, the control contents (for example, adjusted width of the supply voltage) of the control signals S1 to S5 sent at the first time described in the example is different from those of the control signals S1 to S5 sent at the second time. In addition, as described above, the adjustment of the beam current density distribution according to the present invention is performed before the ion implanting is performed on the substrate 8, or is performed whenever each lot is processed in the case where the substrate 8 is processed in the unit of lot.

Figure 2:
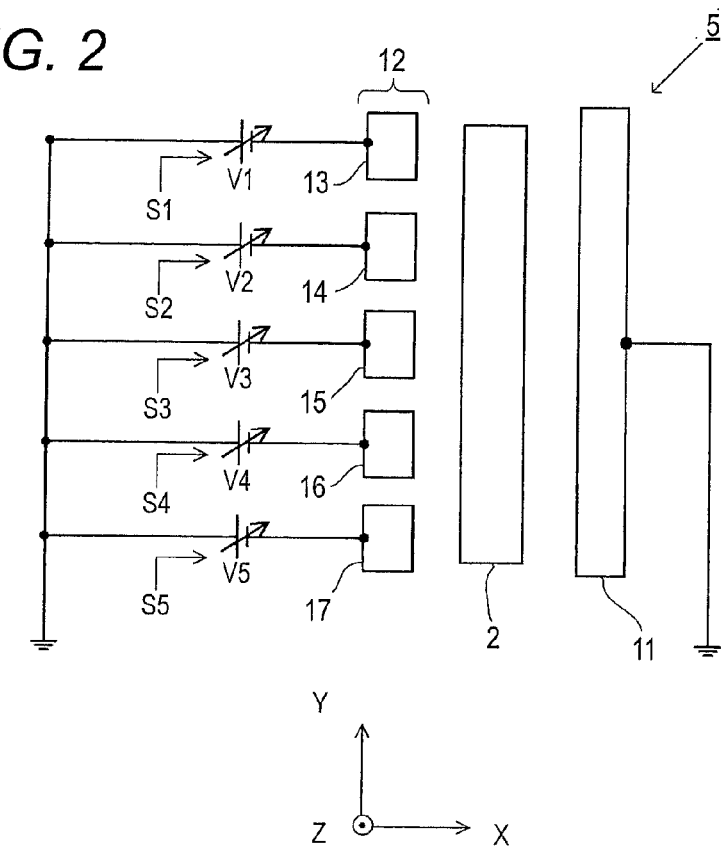
FIG. 2 is a diagram illustrating one example of a deflecting electrode shown in FIG. 1.

In FIG. 2 the configuration of the deflecting electrode is illustrated. As described above, the deflecting electrode 5 consists of the plate electrode 11 disposed at one side and the electrode group 12 disposed at the other side, with the ion beam 2 being interposed between the plate electrode and the electrode group from the short side direction. More specifically, as illustrated in FIG. 2, the plate electrode 11 is at ground potential, while the first electrode 13, the second electrode 14, the third electrode 15, the fourth electrode 16, and the fifth electrode 17, which configure the electrode group 12, are individually connected to DC variable power sources V1 to V5 to separately adjust the potential of the respective electrodes. Although the number of the electrodes is five sheets in this embodiment, the number of sheets may be more than or less than five sheets.

Figure 3:
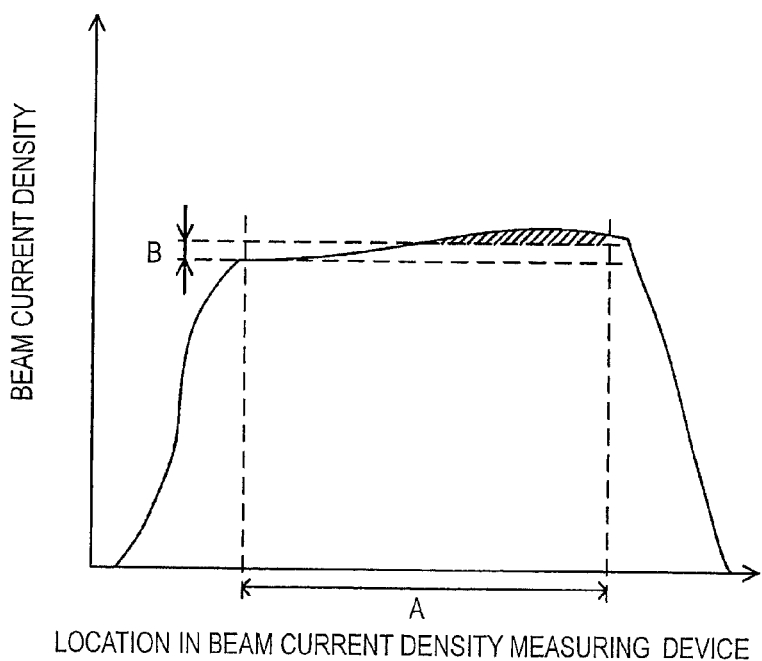
FIG. 3 is a graph illustrating results measured by a beam current measuring device shown in FIG. 1.

In FIG. 3 one example of the beam current density distribution results measured by the beam current measuring device 9 shown in FIG. 1 is illustrated. In the graph illustrated in FIG. 3, a horizontal axis indicates a location (in other words, a location of the ion beam 2 in the long side direction; the direction of the horizontal direction means the Y-direction) in the beam current density measuring device, and a vertical axis indicates beam current density.

The region A illustrated in FIG. 3 corresponds to a region of the ion beam 2 irradiated to the substrate 8. To eliminate ion implantation un-uniformity over the whole area of the substrate 8, it is necessary to make the beam current density of the region indicated by A substantially uniform. Even though being uniform, it is not necessary that the value of the beam current density is a constant value, and it may be a similar value to some extent. The acceptable degree of similarity (uniformity) depends upon a kind of device to be fabricated on the substrate 8. In the region indicated by A in this example, if a value of the beam current density at every location of the longitudinal direction of the ion beam 2 irradiated to the substrate 8 belongs to the region indicated by B on the basis of a location in which the beam current density is the lowest, the value is regarded as being uniform. If taking note of the region A, it would be understood that a part of the region A does not belong to the region B (hatching portion in FIG. 3). Accordingly, to make the beam current density distribution uniform, it is necessary to decrease the beam current density of the region portion which corresponds to the hatching portion deviated from the region B.

Figure 4:
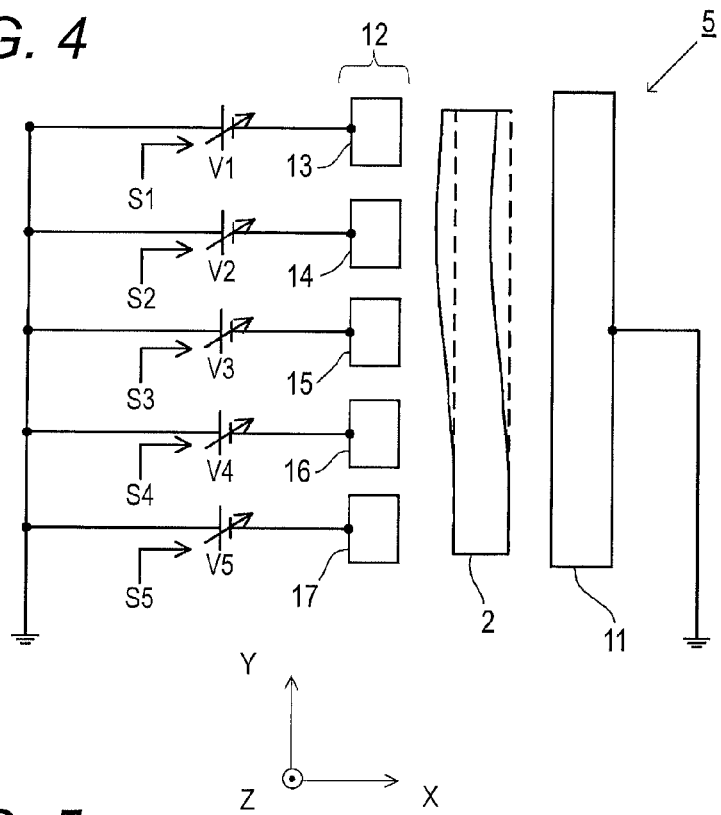
FIG. 4 is a diagram illustrating a state in which an ion beam is locally deflected by a deflecting electrode based on the measured results shown in FIG. 3.

FIG. 4 illustrates the state in which a part of the ion beam 2 is locally deflected by the deflecting electrode 5 illustrated in FIG. 2, based on the measured result shown in FIG. 3. In the drawing, a broken line refers to the appearance of the ion beam 2 incident on the deflecting electrode 5, and a solid line refers to the appearance of the ion beam 2 which is subjected to the local deflection by the deflecting electrode 5. Specifically, all of the first electrode 13, the second electrode 14, the third electrode 15, the fourth electrode 16, and the fifth electrode 17 may be set to have a negative potential when it is determined that the measured result measured by the beam current measuring device 9 is not yet adjusted to the desired beam current density distribution.

The ion beam 2 is locally deflected by making a part of the ion beam 2 corresponding to the hatching portion shown in FIG. 3 collide with the shield member 6 disposed at the downstream side of the deflecting electrode 5, which will be described later, so that the beam current density of the portion is decreased. In the case of this example, the applied voltage is set so that a value (absolute value) of a negative voltage applied to the respective electrodes is decreased in order of the power source V2, the power source V1, the power source V3, and the power source V4. Further, the applied voltage of the power source V5 is set to be 0V. If the potential of the respective electrodes is set by the applied voltage, an electric field is generated substantially from the plate electrode 11 side to the electrode group 12 side in the region between the first electrode 13 to the fourth electrode 16 and the plate electrode 11. The ion beam 2 having the positive charge is locally deflected toward the electrode group 12 side by the electric field.

The degree of the deflection is depended upon the value (potential of the respective electrodes) of the voltage applied to the respective electrodes. Since the value of the voltage applied to the second electrode 14 is the lowest (since it is the highest in terms of absolute value), the ion beam 2 is significantly attracted to the vicinity of the second electrode 14. The ion beam 2 passing through the vicinity of the fifth electrode 17 corresponds to the left end portion, on the paper, of the region A shown in FIG. 3, the beam current density of the portion is not necessary to be decreased. Accordingly, the value of the power source V5 connected to the fifth electrode 17 is set to be 0V in this example. Further, the value of the voltage applied to the respective electrodes is set to an appropriate value by energy of the ion beam 2, in addition to the deflection amount of the ion beam 2.

Figure 5:
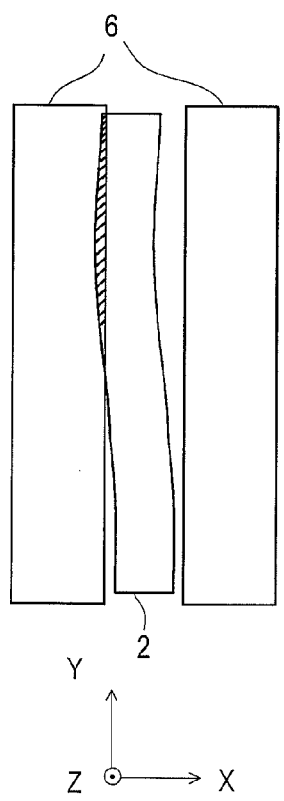
FIG. 5 is a diagram illustrating a state in which the ion beam locally deflected by the deflecting electrode shown in FIG. 4 is shielded by a shield member disposed at downstream side of the deflecting electrode.

In FIG. 5, the state in which a part of the ion beam 2 locally deflected in FIG. 4 collides with the shield member 6 is illustrated. The part of the ion beam 2 locally deflected which corresponds to the hatching portion shown in FIG. 3 collides with the shield member 6. If a part of the ion beam 2 is cut by the collision of the ion beam 2 and the shield member 6, the beam current density of the cut part is decreased. In this way, the beam current density distribution is adjusted.

Although the configuration, in which the power sources V1 to V5 for applying the negative voltage are respectively connected to the respective electrodes configuring the electrode group 12 to set the potential of the respective electrodes, has been described in FIG. 2, the configuration of the present invention is not limited thereto. For example, as illustrated in FIG. 6, a DC variable power source may be connected to the respective electrodes to apply a positive voltage to the respective electrodes.

Figure 6:
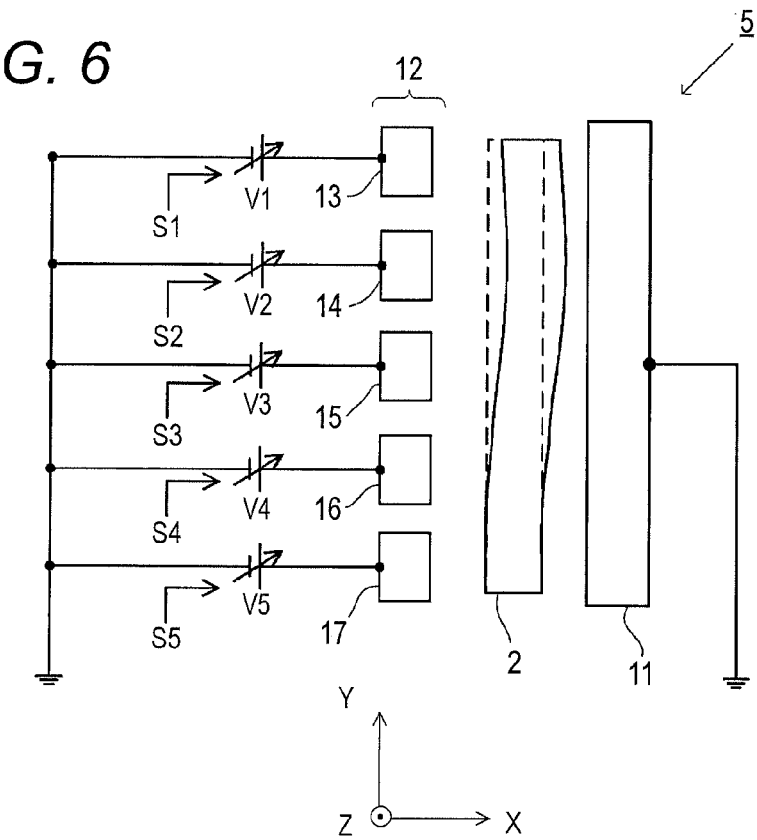
FIG. 6 is a diagram illustrating another example of the deflecting electrode shown in FIG. 2, and illustrates a state in which an ion beam is locally deflected by the deflecting electrode based on the measured results shown in FIG. 3.

In an example illustrated in FIG. 6, the absolute value of the voltage applied to the respective electrodes 13 to 17 is the same as that described in the example illustrated in FIG. 4, but only its polarity is reversed. In this way, an electric field is generated substantially from the electrode group 12 to the plate electrode 11 side between the first electrode to the fourth electrode and the plate electrode 11. The ion beam 2 is locally deflected in a direction opposite to that illustrated in the example of FIG. 4 by the electric field.

Figure 7:
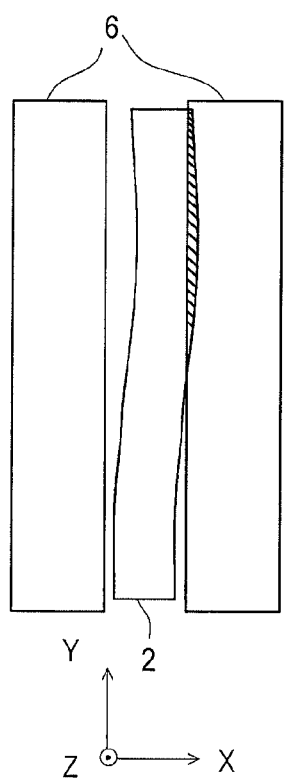
FIG. 7 is a diagram illustrating a state in which the ion beam locally deflected by the deflecting electrode shown in FIG. 6 is shielded by a shield member disposed at downstream side of the deflecting electrode.

In FIG. 7, the state in which the ion beam 2 locally deflected on the deflecting electrode 5 shown in FIG. 6 collides with the shield member 6 is illustrated. As illustrated in FIG. 7, the part of the ion beam 2 which corresponds to the hatching portion collides with the shield member 6. If an amount of the ion beam 2 cut by the collision of the ion beam 2 and the shield member 6 is the same as the amount shown in FIG. 5, the result of the beam current density distribution measured by the beam current measuring device 9 after adjustment of the beam current density distribution is the same. Accordingly, as described in FIG. 4, the power source may be connected to the respective electrodes to apply the negative voltage thereto, and as described in FIG. 6, the power source may be connected to the respective electrodes to apply the positive voltage thereto.

In addition, if the power source capable of changing the polarity is used, it is possible to locally deflect the ion beam 2 in any direction of the electrode group 12 side and the plate electrode 11 side. By combining two sheets of shield plates 6, with the power source and the ion beam 2 being interposed therebetween from the short side direction, the adjustment of the beam current density distribution performed by making the ion beam 2 collide with any of the shield plates 6 which are disposed in the short side direction of the ion beam 2 depending upon the kind of the ionized gas may be selected.

When the energy of the ion beam 2 is low and thus the beam current is small, the configuration explained in FIG. 4 is preferable as compared to the configuration explained in FIG. 6, in consideration of emission of the ion beam 2 due to the space charge effect.

In the configuration described in FIG. 6, electrons contained in the ion beam 2 or electrons floating in the transport path are drawn to the electrode having the positive potential. If the electrons neutralizing the ion beam 2 having the positive charge is decreased, an affect of the space charge effect is largely represented to increase the degree of the emission of the ion beam 2. In this instance, there is a concern that it is difficult to control an incident angle of the ion beam 2 to the substrate 8, or the ion beam 2 collides with a wall surface of the vacuum chamber configuring the transport path of the ion beam 2, so that the beam current amount of the ion beam 2 is decreased more than an expected level.

In the configuration described in FIG. 4, the electrons in the ion beam 2 or the electrons floating in the transport path are reflected from the electrode having the negative potential, and then are again returned to the ion beam 2 or the transport path. Accordingly, since there is no reduction in electron, it is possible to suppress the emission of the ion beam 2 due to the space charge effect.

Figure 8A:
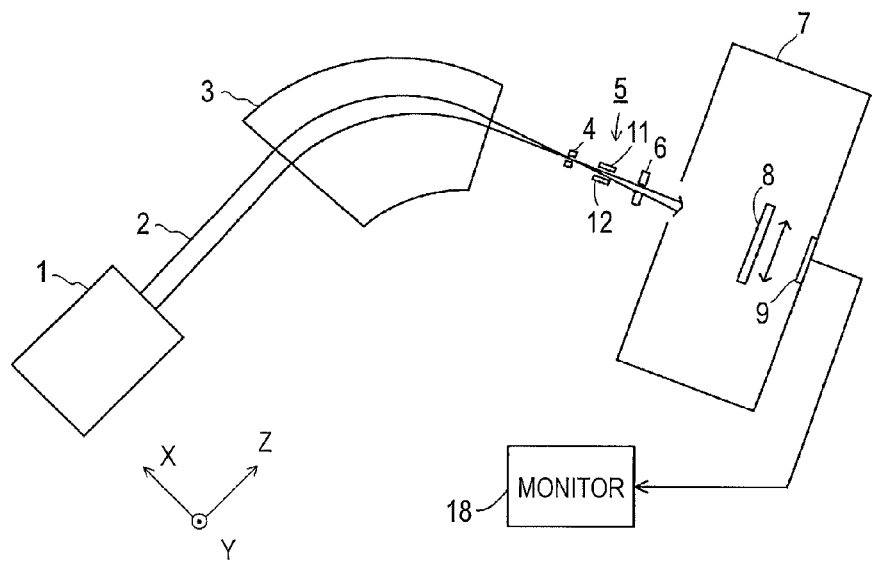
Figure 8B:
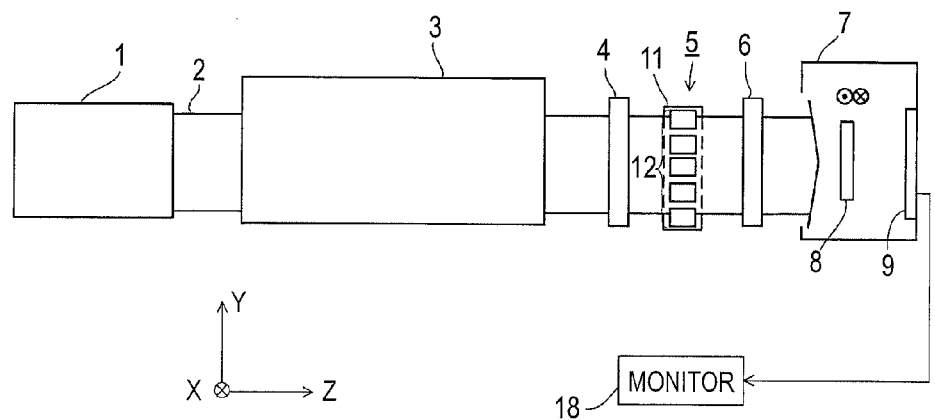

The example of the ion implanter described hereinbefore sets the potential of the respective electrodes configuring the electrode group 12 using the controller device 10, but the configuration of the present invention is not limited thereto. For example, an operator of the ion implanter may set the potential of the respective electrodes configuring the electrode group 12. FIGS. 8A and 8B illustrate an example of the configuration of such an ion implanter.

In the ion implanter of FIGS. 8A and 8B, the result measured by the beam current measuring device 9 is projected on a monitor 18. The operator of the ion implanter verifies the monitor 18 with the naked eye, and appropriately sets the potential of the respective electrodes configuring the electrode group 12. Since the other configuration is identical to that of the apparatus described hereinbefore, the detailed description thereof will be omitted herein.

There is a case where neutral particles are mixed in the ion beam 2 irradiated to the substrate 8. These neutral particles are generated, for example, by making the ion in the ion beam 2 collides with the gas remaining in the transport path and neutralizing the ion. In the case where the beam current measuring device 9 consists of the Faraday cups, it is not possible to detect the neutral particles. Accordingly, since the accurate beam current amount irradiated to the substrate 8 cannot be known, it is difficult to control the amount of the ion implanted to the substrate 8 based on the result measured by the beam current measuring device 9.

Figure 9A:
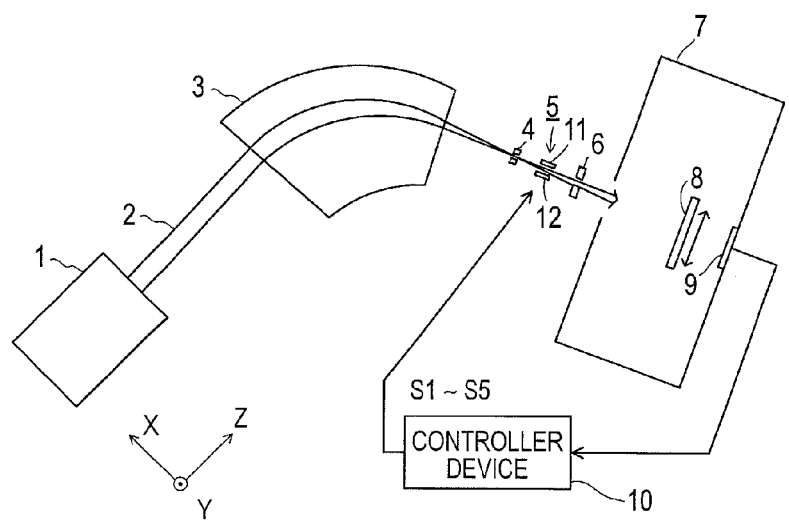
Figure 9B:
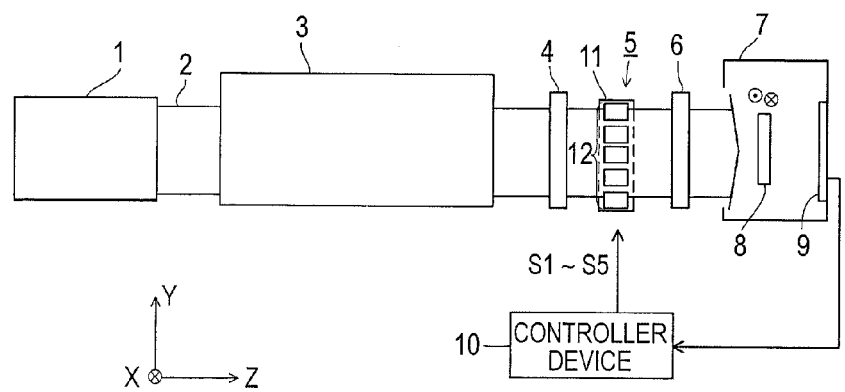

To prevent the neutral particles from being irradiated to the substrate 8, an example of the ion implanter illustrated in FIGS. 9A and 9B can be considered. The neutral particles having no charge are not subjected to the deflection by the deflecting electrode 5. The example eliminates the neutral particles contained in the ion beam 2 by use of a property of the neutral particles.

In FIGS. 9A and 9B, since the basic configuration is substantially identical to the example illustrated in FIGS. 1A and 1B, only the structure for eliminating the neutral particles will be described herein. As described above, the neutral particles are not influenced by the deflection by the deflecting electrode 5. Accordingly, the entire ion beam 2 incident on the deflecting electrode 5 is deflected in the short side direction of the ion beam 2, thereby shifting the whole transport path of the ion beam 2. With the above configuration, the neutral particles which are not influenced by the deflection travel on an extension line (direction of the arrow indicated by a broken line in FIG. 9A) of the transport path of the ion beam 2 incident on the deflecting electrode 5, and then collide with the wall surface of the process chamber 7, thereby preventing the substrate 8 from being irradiated. Therefore, it is possible to accurately control the amount of the ion implanted to the substrate 8.

Figure 10A:
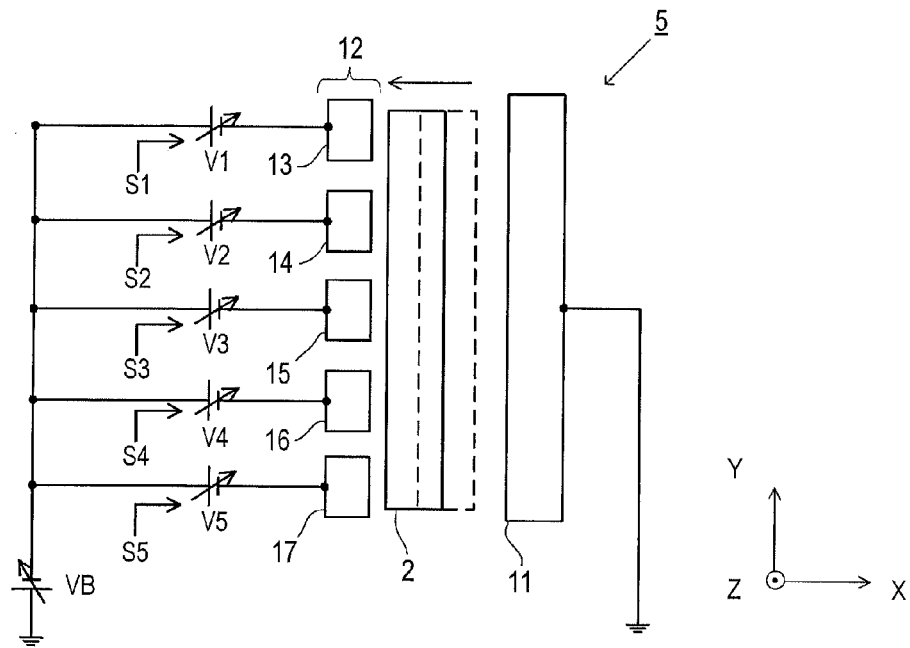
Figure 10B:
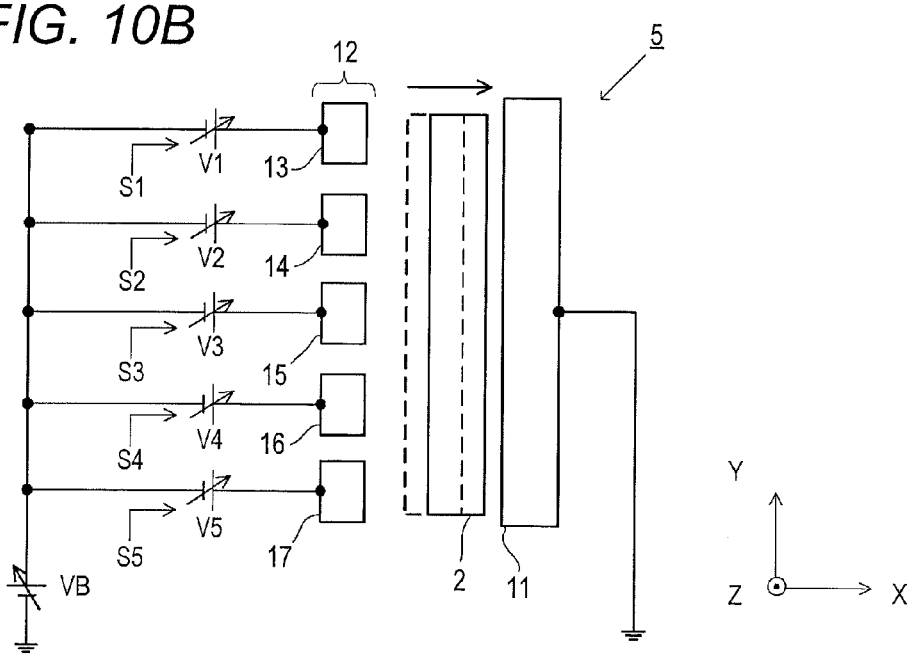

An example of the configuration of the deflecting electrode 5 used in the ion implanter illustrated in FIGS. 9A and 9B are shown in FIGS. 10A and 10B. FIG. 10A illustrates the case where the ion beam 2 is deflected in a left direction on the paper from a state indicated by a dotted line to a state indicated by a solid line. In this example, the power sources V1 to V5 are respectively connected to the respective electrodes configuring the electrode group 12 to apply the negative potential to the electrodes. At first glance, the above configuration seems to be identical to the configuration illustrated in FIG. 4, but a bias power source VB is further provided in the example of FIG. 9A. This is different from the example of FIG. 4.

The bias power source VB is used to deflect the whole of the ion beam 2, thereby eliminating the neutral particles. The power sources V1 to V5 are used to locally deflect the ion beam 2. It may be considered that a value of the voltage applied by the power sources V1 to V5 is set as a desired reference value, and a set voltage of the respective power sources is changed to locally deflect the ion beam 2 on the basis of the reference value. In the case of considering the electric energy spent by the whole power source, it is definitely advantageous to use the configuration illustrated in FIG. 9A. Further, if the extent of deflection for the whole of the ion beam 2 to eliminate the neutral particles is large, the power source having so high voltage source capacity must be prepared. If the respective power sources V1 to V5 is the power source having the high voltage source capacity, a cost is raised. It is preferable to use the configuration illustrated in FIG. 9A from this point of view. Specifically, the bias power source VB collectively may set the potential of all of the electrodes at the negative potential.

Meanwhile, the electrons may be drawn to the respective electrodes. If the energy of the ion beam 2 is strong and the beam current is high, the emission of the ion beam 2 caused by the space charge effect does not hardly occur. Accordingly, the configuration illustrated in FIG. 9B may be utilized. The configuration of FIG. 9B is substantially identical to that of FIG. 9A, except that the polarity of the respective power sources is reversed. Further, in the case of FIG. 9B, the whole of the ion beam 2 is deflected to the plate electrode 11 side (right side on the paper). In addition, FIGS. 9A and 9B illustrate the state in which the whole of the ion beam 2 is deflected to eliminate the neutral particles. In the case of simultaneously adjusting the beam current density distribution, the ion beam 2 does not have a rectangular shape, as illustrated in the drawing, since it is subjected to the local deflection. For example, in the case of simultaneously performing the elimination of the neutral particles and the adjustment of the beam current density distribution, the appearance of the ion beam 2 is combined with the appearance of the ion beam 2 which is indicated by a solid line in FIGS. 4 and 10A.

In the above-described embodiments, it is adjusted so that the beam current density distribution is uniform along the longitudinal direction of the ion beam 2. However, the beam current density distribution to be adjusted is not necessary to be always uniform. For example, the beam current density distribution may be adjusted so that it is not uniform in the longitudinal direction of the ion beam 2 by setting the beam current density of both ends at substantially constant value in the longitudinal direction of the ion beam, and setting the beam current density of the center portion at a different value.

The present invention is not limited to the above-described embodiments and can be variously modified without departing from the scope thereof.

What is claimed is:

1. An ion implanter which emits an ion beam from an ion source and in which an ion implanting is performed to a substrate disposed in a process chamber, wherein the ion beam has a positive charge and a substantially rectangular cross section or a substantially long ellipsoidal cross section having a long side direction and a short side direction, the ion implanter comprising:

a beam current measuring device that measures a beam current density distribution of the ion beam in the long side direction;

a deflecting electrode that deflects at least a part of the ion beam in the long side direction toward the short side direction, based on a result measured by the beam current measuring device; and a shield member that partially shields the ion beam deflected by the deflecting electrode, wherein the deflecting electrode includes a plate electrode and an electrode group including a plurality of electrodes, the electrode group being disposed to face the plate electrode so as to interpose the ion beam between the plate electrode and the electrode group, the plate electrode being positioned along a long side direction that defines the cross section of the ion beam, and the electrode group being positioned along the long side direction of the ion beam, wherein the plurality of electrodes of the electrode group are commonly positioned on a same long side direction of the ion beam, opposite the long side direction where the plate electrode is positioned, the plate electrode is electrically grounded, the plurality of electrodes are electrically independent from each other, and each of the plurality of electrodes is connected to an independent power source from other power sources to perform a potential setting.

2. The ion implanter according to claim 1, wherein
the ion beam in the long side direction has a longer size than the substrate, and
the substrate is transferred along the short side direction of the ion beam when the ion implanting is performed to the substrate.

3. The ion implanter according to claim 2, wherein
when the result measured by the beam current measuring device does not satisfy with a desired value, the plurality of electrodes is set so that all electrodes has a negative potential.

4. The ion implanter according to claim 2, wherein
when the result measured by the beam current measuring device is not a desired value, the plurality of electrodes configuring the electrode group is set so that some electrodes are at a negative potential and the remaining electrodes are at ground potential.

5. The ion implanter according to claim 2, wherein
the plurality of power sources are connected to a bias power source to collectively set potential of the plurality of power sources based on ground potential.

6. The ion implanter according to claim 5, wherein
the bias power source collectively sets the potential of the plurality of power sources at a negative potential.

7. The ion implanter according to claim 1, wherein
when the result measured by the beam current measuring device does not satisfy with a desired value, the plurality of electrodes is set so that all electrodes has a negative potential.

8. The ion implanter according to claim 1, wherein
when the result measured by the beam current measuring device is not a desired value, the plurality of electrodes configuring the electrode group is set so that some electrodes are at a negative potential and the remaining electrodes are at ground potential.

9. The ion implanter according to claim 1, wherein
the plurality of power sources are connected to a bias power source to collectively set potential of the plurality of power sources based on ground potential.

10. The ion implanter according to claim 9, wherein
the bias power source collectively sets the potential of the plurality of power sources at a negative potential.

* * * * *